METHOD OF MAKING A RELIABLE LOW-OHMIC NONRECTIFYING SEMICONDUCTOR BODY

Original Filed May 16, 1966

INVENTOR
MAX J. SCHULLER
BY
ATTORNEY 3,484,796
Patented Dec. 16, 1969

3,484,796

METHOD OF MAKING A RELIABLE LOW-OHMIC NONRECTIFYING SEMICONDUCTOR BODY

Max J. Schuller, Los Altos, Calif., assignor to Hewlett-Packard Company, Palo Alto, Calif., a corporation of California Original application May 16, 1966, Ser. No. 550,206, now Patent No. 3,391,452, dated July 9, 1968. Divided and this application Mar. 29, 1968, Ser. No. 717,324
The portion of the term of the patent subsequent to July 9, 1985, has been dedicated to the Public
Int. Cl. B01j *17/00;* H01l *5/00*
U.S. Cl. 29—578 3 Claims

ABSTRACT OF THE DISCLOSURE

A masking layer having an opening therein is formed on an N-type layer, and a P-type region is diffused through the opening in the masking layer into the N-type layer to the depth of a contiguous P-type layer. The opening in the masking layer is then enlarged to expose a previously unexposed portion of the P-type region that diffused beneath the masking layer. A metal contact is formed entirely on the P-type area exposed by the enlarged opening and in contact with the previously unexposed portion of the P-type region. Before forming the metal contact, another P-type region may be diffused through the enlarged opening in the masking layer to insure that all of the area exposed by the enlarged opening is P-type.

CROSS-REFERENCE TO RELATED APPLICATION

This is a divisional application of patent application Ser. No. 550,206 entitled Method of Making a Reliable Low-Ohmic Nonrectifying Connection to a Semiconductor Substrate filed May 16, 1966 by Max J. Schuller now Patent No. 3,391,452.

BACKGROUND AND SUMMARY OF THE INVENTION

This invention relates to a method of making a reliable low-ohmic nonrectifying connection to a semiconductor body and, more particularly, to a diffused region in a semiconductor body.

In many integrated circuit chips a circuit is fabricated on an upper semiconductor layer of one conductivity type, and a contiguous semiconductor substrate of a different conductivity type is used as a common voltage plane that is connected through the upper semiconductor layer to selected portions of the circuit. The advantage of using the substrate in this manner is that it saves space on the integrated circuit chip by eliminating a voltage bus and therefore permits the packing density of the integrated circuit to be increased. However, the substrate can only be used in this manner when both the resistance of the substrate and the resistance of the connection to the substrate are kept below some minimum value which varies from integrated circuit to integrated circuit.

The conventional method of making a connection to a substrate is illustrated with the aid of FIGURE 1 which shows, for example, an N-type upper layer 10 and a contiguous P-type substrate 12. A masking layer 14 is formed on the N-type upper layer 10. This masking layer 14 is provided with an opening 16*a* or *b* through which an impurity such as boron is diffused to form a P-type region 18 that extends to the P-type substrate 12. An insoluble high-resistance boron film 20 is formed on the surface of the region 18 during this diffusion. The boron film 20 separates a metallic contact 24*a* or *b* that is subsequently formed in the opening 16*a* or *b* from the surface of the P-type region 18 so that the resistance of the connection to the P-type substrate 12 is substantially increased. Thus, the connection resistance as measured between the metallic contacts 24*a* and *b* for integrated circuit chips tested was typically greater than eighty ohms. Moreover, the boron film 20 caused an open circuit between some of the metallic contacts and formed a rectifying junction between others. One cannot be sure that this boron film 20 will be removed by etching without exposing the integrated circuit chip to the etchant for a length of time which may harmfully erode other parts of the integrated circuit.

Accordingly, it is the principal object of this invention to provide a method of making a reliable, low-ohmic nonrectifying connection to a semiconductor body without regard to the formation of a boron film or the like.

This object is accomplished according to the illustrated embodiment of this invention by enlarging the opening 16*a* or *b* in the masking layer 14 once the boron diffusion has been performed to expose a portion of the region 18 on which the boron film 20 has not been formed. Thus, when the metallic contact 24*a* or *b* is subsequently formed in the opening 16*a* or *b* it makes direct contact with this portion of the region 18.

Other and incidental objects of this invention will be apparent from a reading of this specification and an inspection of the accompanying drawing.

DESCRIPTION OF THE PREFERRED EMBODIMENT

Figure 1:
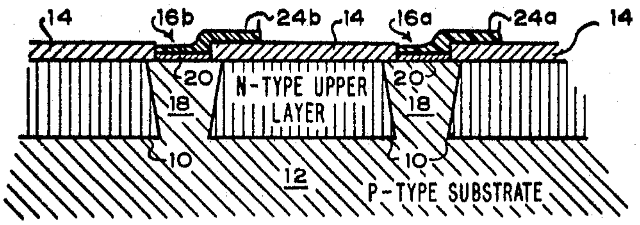
Figure 1 PRIOR ART
FIGURE 1, already referred to above, is a sectional view of an integrated circuit chip illustrating the conventional method of making a connection to a substrate.
Figure 2:
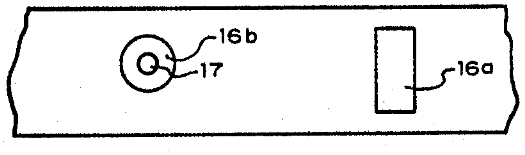
FIGURE 2 is a top view of an integrated circuit chip illustrating the first step in making a connection to a substrate according to a preferred embodiment of the method of this invention.
Figure 3:
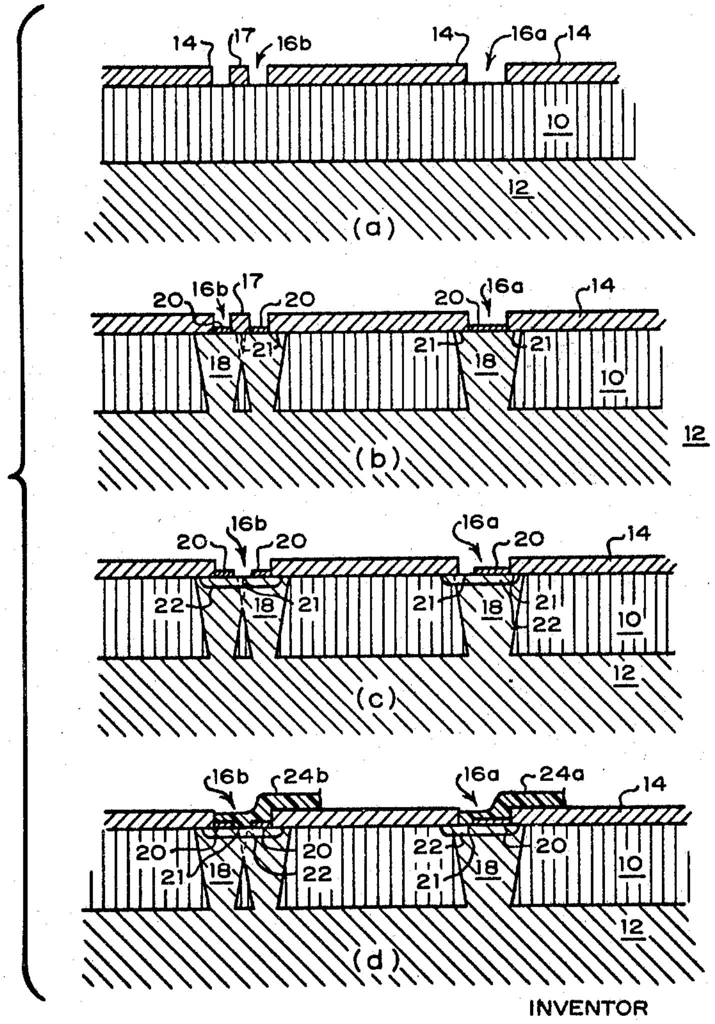
FIGURE 3 is a series of sectional views of the integrated circuit chip of FIGURE 2 illustrating each of the steps in this preferred embodiment.

Referring now to FIGURES 2 and 3(*a*), there is shown a semiconductor chip comprising, for example, an upper layer 10 of N-type silicon on which an integrated circuit is to be formed and a substrate 12 of P-type silicon which is to be used as a common voltage plane for selected portions of the integrated circuit. The first step in connecting one of these selected portions of the integrated circuit to the P-type substrate 12 through the N-type upper layer 10 is to form a silicon dioxide masking layer 14 on the surface of the N-type upper layer. An opening 16*a* or *b* is etched in the masking layer 14 so as to expose a selected area of the N-type upper layer where it is desired to form the connection to the P-type substrate 12. However, this opening is made smaller than the area on which a metallic contact terminal 24*a* or *b* is to be formed during a subsequent step. This may be done in many ways as indicated by the masking layer island 17 which is retained within the opening 16*b*.

The next step, as shown in FIGURE 3(*b*), is to diffuse an impurity such as boron into the N-type upper layer 10 through the openings 16*a* and *b* so as to form P-type regions 18 which extend through the N-type upper layer to the P-type substrate 12. This may be done, for example, by depositing boron on the exposed surface of the N-type upper layer 10 at a temperature of about 1100° C. for about twenty minutes. The diffusion which is started during this depositing substep is completed at a temperature of about 1200° C. for about two hours. During this diffusion step an insoluble high-resistance boron film 20 of about one thousand angstroms in thickness is formed on the exposed surface of each region 18.

There is sufficient lateral diffusion during the diffusion step so that a portion 21 of the upper surface of each region 18 extends laterally beneath the masking layer 14 a finite distance from the edges of the opening 16*a* or *b* associated with that region. Since this portion 21 of the upper surface of each region 18 is covered by the masking layer 14 the boron film 20 is not formed thereon during the diffusion step. Thus, the next step, as shown in FIGURE 3(*c*), is to enlarge the openings 16*a* and *b* in the masking layer 14 so as to at least partially expose the portion 21 of each region 18. This is done, for example, by etching away some of the masking layer 14 at one side of the opening 16*a* and by etching away the masking layer island 17 previously retained within the opening 16*b*.

Although not essential, the next step which is also shown in FIGURE 3(*c*) may be to diffuse a thin P-type layer 22 into the upper surface of each region 18 through the enlarged opening 16*a* or *b* associated therewith to be sure that all of the surface area exposed by enlarging that opening is made a part of the P-type region 18. his may be done by depositing boron on the surface exposed by the enlarged openings 16*a* and *b* at a temperature of about 1000° C. for about ten minutes. The diffusion which is started during this depositing substep is completed at a temperature of about 1200° C. for about one hour. Any boron film that may be formed during this diffusion step is insignificant compared to the boron film 20 formed during the first diffusion step because of the shorter diffusion time and the lower predeposit temperature. Moreover, it can be easily removed in an etching substep of short duration that will not harm other portions of the integrated circuit. This second diffusion step may be performed at the same time the base regions of the transistor portions of the integrated circuit are being formed since these base regions are formed in a similar manner.

The last step, as shown in FIGURE 3(*d*), is to form, for example, an aluminium contact terminal 24*a* or *b* on the exposed portion 21 of each region 18. Since each exposed portion 21 is free of the boron film 20 the aluminum contact terminals 24*a* and *b* are connected directly to the P-type regions 18 and, hence, to the P-type substrate 12. Thus, a reliable, low-ohmic nonrectifying connection is made between the P-type substrate 12 and selected portions of the integrated circuit connected to the aluminum contact terminals 24*a* and *b*. The connection resistance as measured between the metallic contact terminals 24*a* and *b* for integrated circuit chips tested was typically about eight ohms, or an order of ten lower than the lowest resistance that was measured when the conventional method was used to form similar connections to the P-type substrate 12.

I claim:

1. A method of forming a low-ohmic nonrectifying contact on a semiconductor body, said method comprising the steps of:

forming upon a surface of said semiconductor body a masking layer having an opening therein exposing a selected area of said surface;

diffusing into said semiconductor body through said opening a region having an unexposed portion that extends laterally beneath said masking layer at said surface a finite distance from the edge of said opening;

enlarging said opening to expose the previously unexposed portion of said diffused region that extends laterally beneath said masking layer; and forming an electrically conductive contact through the enlarged opening in said masking layer, said electrically conductive contact being formed entirely upon the diffused region and in contact with the previously unexposed portion of said diffused region that extends laterally beneath said masking layer.

2. A method as in claim 1 including after said opening enlarging step and before said contact forming step the additional step of diffusing into the exposed area of said semiconductor body through said enlarged opening another region of the same conductivity type as the previously diffused region, said other diffused region being substantially thinner than the previously diffused region.

3. A method as in claim 2 wherein said semiconductor body is N-type and said diffused regions are P-type.

References Cited

UNITED STATES PATENTS 3,391,452 7/1968 Schuller ............ 29—578

PAUL M. COHEN, Primary Examiner

U.S. Cl. X.R.

148—187